United States Patent [19]

Carmean et al.

[11] Patent Number: 5,459,673
[45] Date of Patent: Oct. 17, 1995

[54] METHOD AND APPARATUS FOR OPTIMIZING ELECTRONIC CIRCUITS

[75] Inventors: Douglas Carmean, Beaverton, Oreg.;
Yatin Mundkur, Austin, Tex.

[73] Assignee: Ross Technology, Inc., Austin, Tex.

[21] Appl. No.: 225,492

[22] Filed: Apr. 11, 1994

Related U.S. Application Data

[63] Continuation of Ser. No. 122,132, Sep. 14, 1993, abandoned, which is a continuation of Ser. No. 900,516, Jun. 17, 1992, abandoned, which is a continuation of Ser. No. 605,121, Oct. 29, 1990, abandoned.

[51] Int. Cl.$^6$ .................................................... G06F 17/50
[52] U.S. Cl. ................................. 364/489; 364/488
[58] Field of Search ........................... 364/488, 489, 364/490, 491

[56] References Cited

U.S. PATENT DOCUMENTS

| | | | |
|---|---|---|---|
| 4,651,284 | 3/1987 | Watanabe et al. | 364/491 |
| 4,656,592 | 4/1987 | Spaanewberg et al. | 364/490 |
| 4,783,749 | 11/1988 | Puzzy et al. | 364/490 |
| 4,803,636 | 2/1989 | Nishiyama et al. | 364/491 |
| 4,805,113 | 2/1989 | Ishii et al. | 364/491 |
| 4,827,428 | 5/1989 | Dunlop et al. | 364/491 |
| 4,882,690 | 11/1989 | Shinsha et al. | 364/490 |
| 4,896,272 | 6/1990 | Kurosawa | 364/491 |
| 4,967,367 | 10/1990 | Piednoir | 364/489 |

*Primary Examiner*—Vincent N. Trans
*Attorney, Agent, or Firm*—Irell & Manella

[57] ABSTRACT

A method and apparatus for sizing components of an electronic circuit by replacing standard cells representative of the components in the circuit with other standard cells from a standard cell library in order to improve the performance so that the circuit meets certain predetermined user-specified criteria. A computer program implementation ("the sizing system") of this method is described. This implementation receives command line options from the user, builds an internal representation of the external standard cell library, builds a database describing the connectivity of the circuit, computes the capacitance seen at each node in the circuit, and queries the user for additional command options. One such option is for the sizing system to size the circuit, via a heuristic algorithm, by replacing standard cells in the circuit with others from a standard cell library in order to improve the circuit's performance.

12 Claims, 7 Drawing Sheets

METHOD AND APPARATUS FOR OPTIMIZING ELECTRONIC CIRCUITS

This is a continuation of application Ser. No. 08/122,132 filed Sep. 14, 1993, which was abandoned upon the filing hereof and which was a continuation of application Ser. No. 07/900,516 filed Jun. 17, 1992, which was a continuation of application Ser. No. 07/605,121 filed Oct. 29, 1990, both of which have also been abandoned.

BACKGROUND OF THE INVENTION

This invention relates generally to the computer-aided design of electronic circuits and, more specifically, to a method and apparatus for conforming such a circuit to given performance criteria (such as load and timing requirements specified by a user) by replacing standard cells representative of the components in the circuit with other standard cells from a standard cell library in order to improve the performance of that circuit. It is especially useful in the design of very large scale integrated (VLSI) microprocessor circuits.

A typical structured VLSI microprocessor design cycle consists of five stages: (1) architecture and instruction set design; (2) micro-architecture design and functional model validation; (3) logic design and schematic capture; (4) circuit design; and (5) physical layout. These stages are described below. It is to stage 4 that the present invention is directed.

Stage 1: During the architecture and instruction set design stage, a new microprocessor architecture is designed either to overcome performance problems in previous designs or to solve, using hardware, problems which have not been solved hitherto.

For instance, in reduced instruction set computing (RISC) microprocessor architectures, which are founded on the premise that a smaller instruction set allows a faster and more efficient design, an instruction set is designed so that one may solve problems in the shortest possible time using the smallest possible set of instructions.

During architecture design, one insures that the design is feasible and that no unreasonable assumptions are being made at this stage. The end product is a set of specifications that the final product must meet, as well as a set of assumptions made in creating this set of specifications.

Stage 2: Once the architecture and instruction set are designed, the designer validates them by building a behavioral model of the circuit which will implement this architecture. The behavioral model of the circuit describes its function by using equations to relate inputs to outputs. This will typically be done using a program such as Lsim, which is a logical simulation program from Silicon Compiler Systems. The behavioral model is tested using the Lsim program.

The initial set of specifications is decomposed into a set of blocks and sub-blocks in order to divide the design problem into a set of smaller design problems. An attempt is made to insure that these blocks correspond to blocks of logic on the final chip. A well-defined microarchitecture results from this stage—in which all internal registers, clock signals and their phase relationships, etc., are specified.

Stage 3: Logic design and circuit schematic capture follows functional model validation. As a result of this stage, the blocks in the circuit are defined by logic equations, state diagrams, and timing and sequencing information. That is, when the designer has determined that the behavioral model of the circuit meets the desired specifications, then the designer creates a schematic block diagram of the circuit, where each block includes one or more standard cells which are in a standard cell library. A standard cell library is a collection of commonly-used logic blocks which have been designed as transistor level circuits and which have been simulated in order to determine their operating characteristics and parameter values. The "standard cell" stored in memory is a representation of the characteristics of the component represented by a block of the block diagram.

A netlist (short for "network list") describing the connectivity of the circuit is also generated from this stage. A netlist is an ASCII table which lists all of the blocks in the circuit along with their corresponding inputs and outputs. Hence, information about the connections between the blocks in the circuit is also present in the netlist.

Stage 4: The next stage is the circuit design stage. During circuit design, logic blocks are replaced with standard cells from the standard cell library. The logic blocks in the circuit are then optimized in order to maximize speed and minimize circuit area and power dissipation, while maintaining adequate noise margins. All timing specifications must be met during circuit design.

Stage 5: Once the circuit has been designed, a physical layout is generated. At this point, the designer lays out each layer of the chip, including leaf level cells, power, ground and control signals.

Circuit Design Fundamentals

During circuit design (stage 4 above), the designer's main objective is to create a circuit with the smallest possible area (to maximize manufacturing yield) and the fastest possible speed. The goal of minimizing area size leads to complications, however, because as the feature sizes of transistors in a circuit are reduced, the parasitic resistance, capacitance and inductance effects of interconnections between transistors in the circuit become increasingly pronounced. The values of these parasitic parameters depend on interconnection length, interconnection material, and transistor gate area. There is an inverse relationship between a load transistor's gate area and the speed of the transistor driving it.

The concepts of "circuit delay" and "propagation delay" are important in determining the characteristics of a circuit. Circuit delays occur in part because voltage changes across a capacitor cannot happen instantaneously. For example, consider a circuit which consists of a resistor (with resistance R) in series with a capacitor (with capacitance C). If, at time t=0, the capacitor is uncharged and a voltage V is applied across the circuit, the voltage across the capacitor, at any time t, is given by:

$$V_c(t) = V(1 - e^{-t/RC}).$$

The quantity RC, which has the dimensions of time, is called the time constant of the circuit and is equal to the time for the capacitor to charge up to approximately 63% of its maximum value. Typically, it takes about 5 RC for the voltage across the capacitor to rise or fall to within 1% of its steady state value (in this case, rise to above 0.99 V). This time is called the charge delay $t_c$ or discharge delay $t_d$.

The propagation delay in a circuit is measured as the time delay for a switching transition to occur at the output of a circuit in response to a transition at the input. This delay may be expressed as $t_p = t_{out} - t_{in}$, where $t_{in}$ is the time the input voltage crosses threshold voltage $V_t$, and $t_{out}$ is the time the output voltage crosses $V_t$. Propagation delays are due to a variety of causes, including interconnection delays between, and circuit delays at, the driver and the load.

In CMOS circuits, the above relations cannot be directly applied. First, the resistance R of a MOS transistor is a nonlinear function of its terminal voltages, the type of transistor (n-, p-, enhancement or depletion), and the context of its use (pull-up, pull-down or pass). Second, the resistance varies with the rate of input transition—that is, the transistor's steady state resistance differs from its fast transition resistance. Similarly, capacitances in MOS circuits are also nonlinear functions of transistor terminal voltages.

To account for such nonlinear variations in R and C, with terminal voltages, in MOS circuits, circuit simulators such as SPICE have very complicated MOS transistor models, which can simulate transistor behavior to great accuracy. See, for instance, L. Nagel, *SPICE: A Computer Program to Simulate Semiconductor Circuits* (May 1975), which is incorporated herein by reference. Such simulators, however, have a decided disadvantage in the amount of computation time needed to do the simulation.

Instead of using a simulator such as SPICE, one can investigate a circuit's performance with a fair degree of accuracy by determining the circuit's resistance and capacitance. The time constant RC of a circuit determines the maximum frequency at which the circuit can be clocked. Of the two parameters R and C, the capacitance C has a predominant influence over the time constant RC. Moreover, the designer has greater control over the capacitance of a circuit than its resistance. Thus, capacitance plays an important role in determining the propagation delay, circuit delay and maximum frequency of a circuit.

In general, reference in this application to capacitance may equivalently be assumed to take into account the resistance, and hence the RC timing factor. This is because the present invention is directed to optimizing the characteristics of circuits by adjusting capacitance, not resistance. Unless otherwise stated, the resistance in each case may be assumed to be held constant.

SUMMARY OF THE INVENTION

It is therefore an objective of this invention to provide a method and apparatus for automatically determining the effective capacitance seen at each node of a circuit, and from that determining the propagation delay through each of the nodes, without requiring the computation time of presently available simulation schemes.

It is a further objective of this invention to provide such a method and apparatus wherein the propagation delays seen at each node in the circuit can be decreased by replacing standard cells in the circuit with standard cells from a standard cell library possessing parameter values which will minimize the propagation delays in the circuit when necessary to meet predetermined criteria. By minimizing a circuit's propagation delays, one can maximize its speed.

Further objectives and advantages will more fully appear in the course of the following discussion.

The present invention is therefore directed to a method and apparatus for assisting designers of circuits, particularly integrated circuits, in automatically sizing CMOS standard cell circuits which use standard cells described in a given standard cell library format, such as the ROSS Standard Cell Library format. The system of the invention shall be referred to as the sizing system or "Sizer".

Typically, a company in the circuit design business will develop its own library of standard cells. Engineers, then, use these standard cells as modules in their new circuit designs. Such a standard cell library will normally contain numerous standard cells, grouped by specific function, along with their known electronic operating characteristics and parameter values (including resistance and capacitance).

In a standard approach to meeting timing specifications for a circuit, a designer first computes the propagation delay for each possible circuit path from input to output in order to determine whether that circuit meets the desired timing criteria overall. One way to compute the propagation delay along a path is to simulate that path using a circuit simulator, such as SPICE, and determine whether or not it meets the timing criteria. Then, one must manually modify the logic and/or circuit design to meet those criteria. Such an approach is not, however, a true top-down approach, as would be ideal in the microprocessor design cycle described above; rather, it is a combination of top-down and bottom-up design.

In general, in the present invention, a strategy of stepwise, iterative refinement is used between the two design steps described above—i.e., the determination of whether a given circuit design meets the timing criteria and the redesign of that circuit based upon that determination. It is the interdependence between a transistor's gate area and a given circuit's maximum operating frequency that prevents a general circuit optimization theory from being developed. Hence, a heuristic approach is necessary.

The present invention implements such an approach, using a combination of heuristics and prior circuit simulation. The standard cell library contains prior circuit simulations of many standard cells. The system of the present invention compares the parameter values of these library standard cells to those of standard cells in the circuit to be sized in order to determine whether circuit performance would be enhanced by substitution. The sizing system uses a heuristic approach to breaking circuit loops between outputs of the circuit and inputs to the same circuit.

As input, the sizing system requires a netlist (in the form of an ASCII file describing circuit connectivity) of the circuit to be sized. In this case, the netlist required is an unmodified Lsim netlist and is generated by the Lsim program.

As discussed above, a standard cell library file (containing a characterization file) and a supplemental process file are also needed. When the sizing procedure is carried out, the standard cells represented by the various blocks of the block diagram are obtained from this standard cell library, and in the sizing procedure the characteristics of each standard cell are evaluated to determine whether the predetermined user criteria of the circuit are met. As a result of the process, an appropriately-sized standard cell is selected by the method of the invention, minimizing the size of the cell while accommodating the load on the cell.

The characterization file, which is a subset of the standard cell library, contains process-dependent parameter values for the various standard cells in the library ("process-dependent" means that the values are dependent on the particular manufacturing process used to create the actual cell).

The supplemental process file fills in any gaps in the characterization file. For instance, in some cases, two parameters of a standard cell have the same value, and the characterization file lists the value of only one of these parameters; thus, the value for the other parameter is not explicitly represented in—i.e., is missing from—the characterization file. The supplemental process file therefore contains parameter cross-reference pairs which indicate the values of such missing parameters by linking a missing parameter with one for which a value is present in the characterization file.

Finally, the sizing system takes, as input, performance criteria against which to size the circuit. For instance, as one criterion, one might specify a particular circuit path from input to output and require that a valid output appear within ten nanoseconds after some input.

The output of the sizing system is a "sized" Lsim netlist of a circuit which is functionally the same as the original circuit but which may use different standard cells than those in the original circuit. If possible, the sized circuit will meet the specified performance criteria. Otherwise, the sizing system issues diagnostic messages explaining its inability to adhere to the criteria.

The sizing program itself is divided into four major functions, as follows: (1) it builds an internal database which contains information from the standard cell library and process files; (2) it builds an internal database which represents the circuit's connectivity; (3) it computes the capacitance at each node of the circuit; (4) it sizes the circuit by replacing standard cells in the circuit with others from the standard cell library.

The sizing system sizes the circuit (step 4 above) by starting at the output of the circuit and tracing back to its inputs. At each node, it compares the load seen at that node with the maximum allowable load which would still be satisfied by the drive capability of that cell path. If the load seen is less than the maximum allowable load, the sizing system moves on to the next node toward the input. Otherwise, it attempts to size the cell which drives the node, so as to match its drive capability with the capacitance at that point. In addition to load matching, i.e., insuring that the driver at each node is capable of driving the load at that node, the system of the invention insures that timing characteristics are met for each circuit path.

If the timing requirements for a path using a particular cell are not met, the sizing system searches the standard cell library for a functionally equivalent cell with parameter values which would, upon substitution, improve the performance of the circuit. If an appropriate cell is found, the sizing system replaces the unsatisfactory cell with the new cell. The sizing system then moves to the previous stage in the circuit (i.e., the next stage toward the input), and performs the operation again. This is repeated until the sizing system reaches the input to the circuit. If the sizing system had replaced any cells during its most recent traverse through the path being optimized, it repeats the process for that path until no cells are replaced. At this point it stops execution.

If the sizing system is unable to find at least one appropriate replacement cell for a given unsatisfactory cell that would satisfy the performance criteria, the sizing system issues diagnostics indicating where and why it failed. In this case, one will either have to find or design at least one appropriate replacement cell which is not currently in the standard cell library, or modify the circuit's logic design and reoptimize the new design.

In general, capacitances in MOS circuits are expressed either in picofarads ($10^{-12}$ farads) or femtofarads ($10^{-15}$ farads). However, using these physical units can make algorithmic computation cumbersome, so a unit called "equivalent gate load" is used internally by the sizing system for sizing transistors. Thus, in the sizing program, all capacitances, whether parasitics or gate, are expressed in terms of multiples of gate capacitances of a predetermined minimum-size transistor.

The load used to compute an equivalent gate load is based upon: (a) the output capacitance of the driver; (b) the interconnection capacitance between the driver and the load; and (c) the gate capacitance of the load.

Once the sizing system has built its internal databases, it can perform functions other than simply sizing a circuit. Among these are: estimation of power dissipation in a circuit; generating an HSPICE netlist from an Lsim netlist; and back-annotating an Lsim schematic netlist with the sized circuit parasitics. The back-annotation, combined with the sizing operation itself, permits a designer to submit a circuit schematic to the sizing system and obtain as output a fully sized circuit with all changes reflected in the schematics and the database. One of the primary advantages of the sizing system program is that the sizing system shows extremely good runtime performance as compared with presently available circuit simulators, such as SPICE.

BRIEF DESCRIPTIONS OF THE DRAWINGS

Figure 3A:
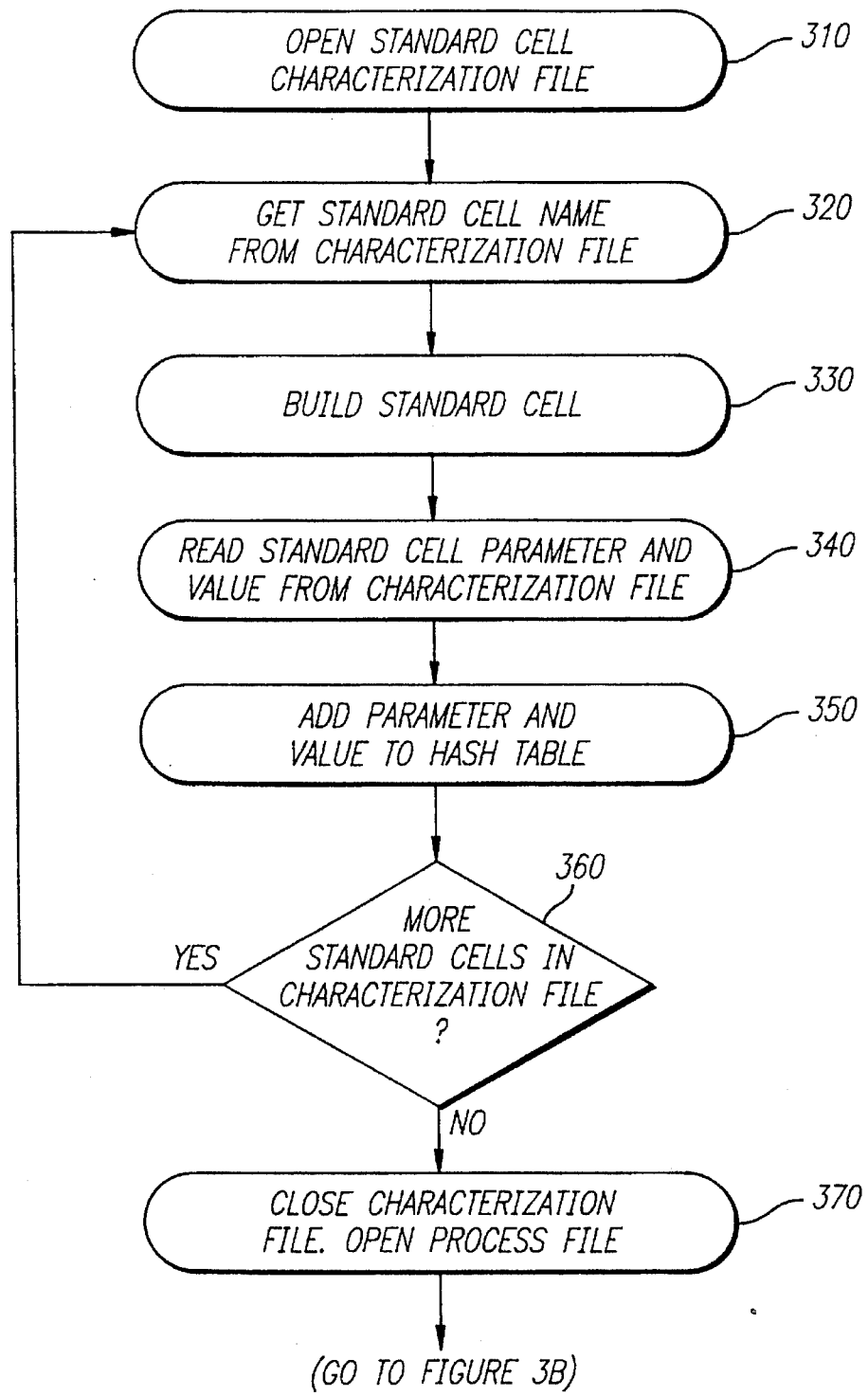
Figure 3B:
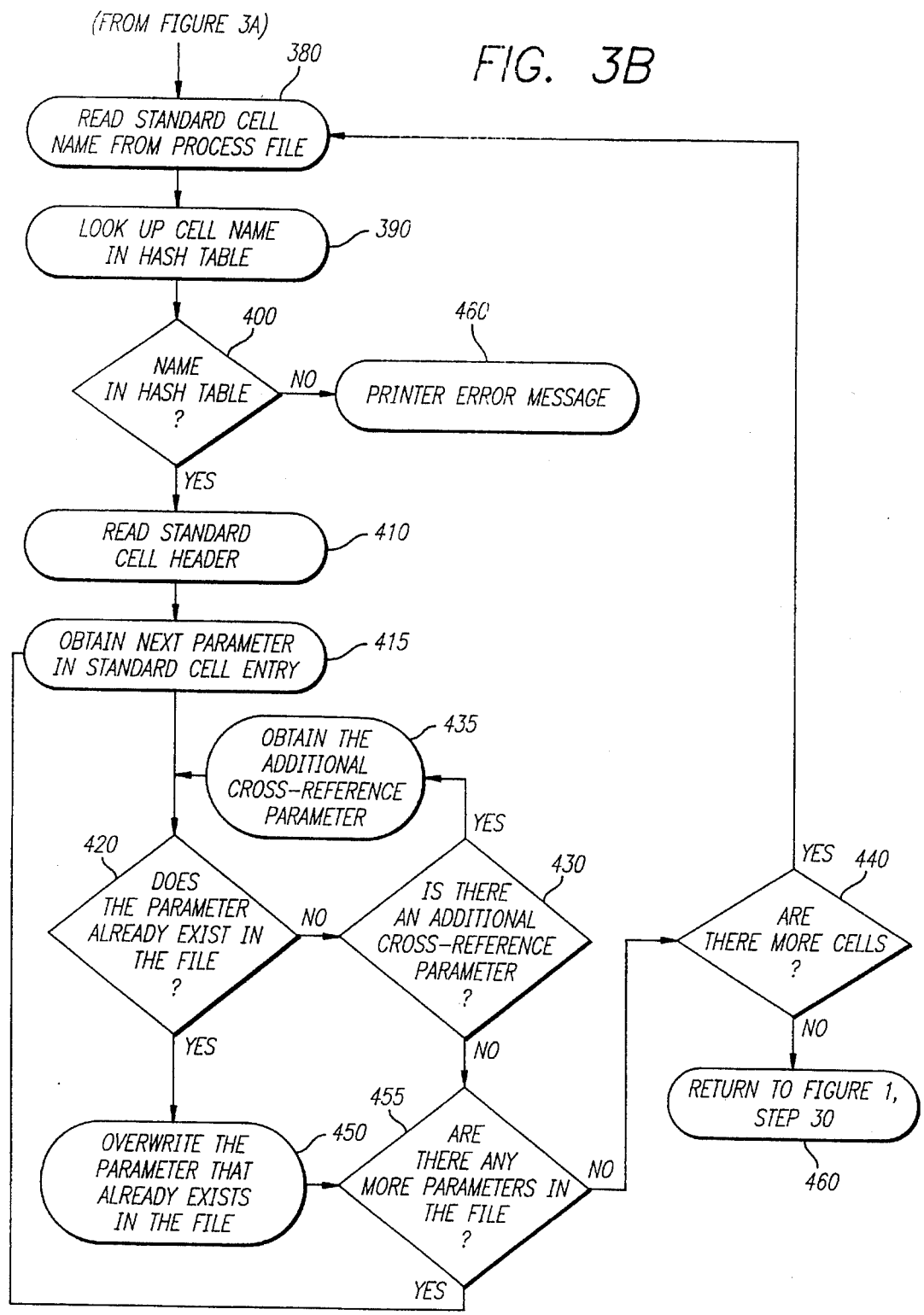

FIGS. 3A and 3B together constitute a flow chart of the process for building the circuit connectivity database.

Figure 4:
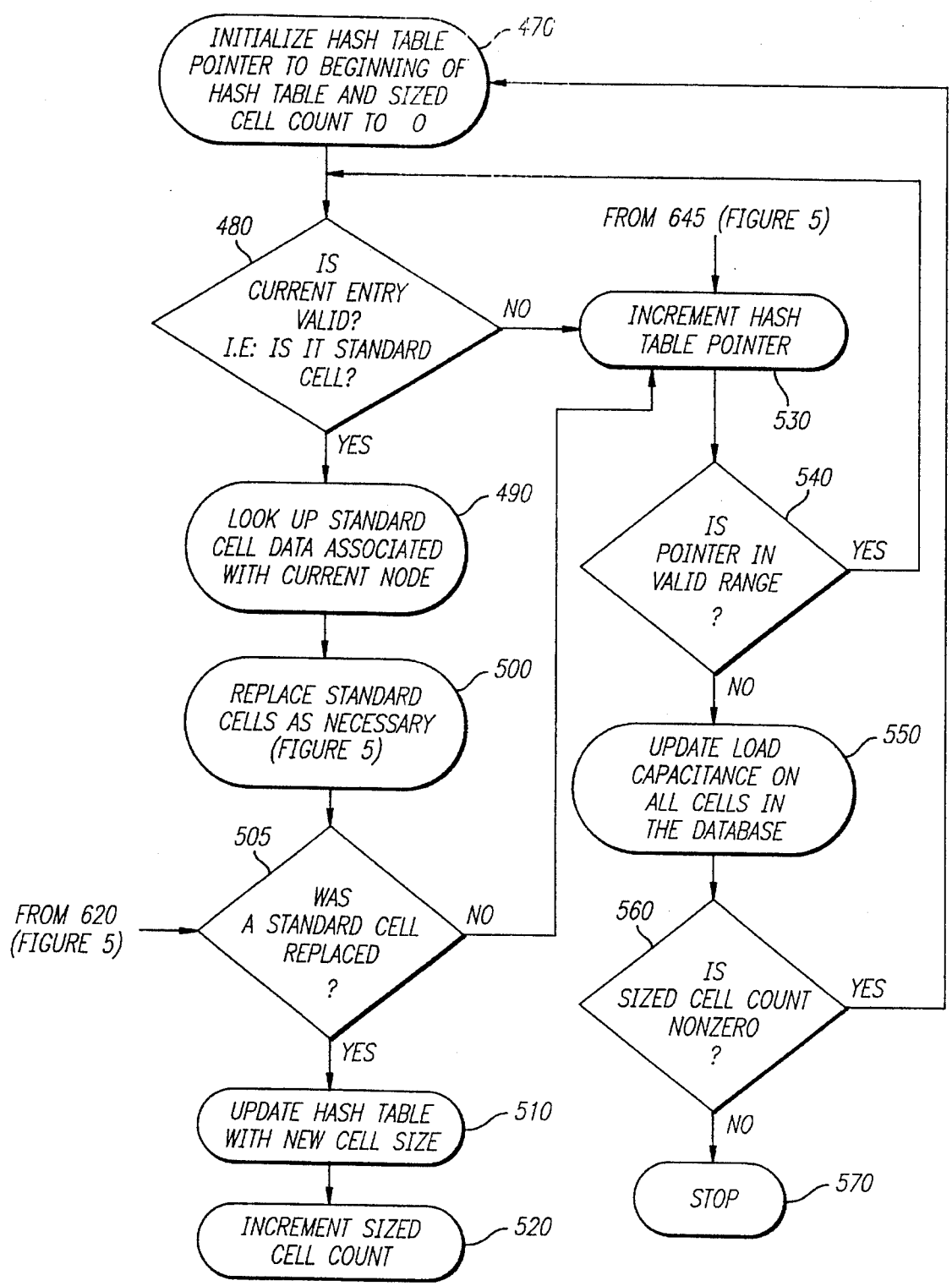

FIG. 4 is a flow chart for the sizing routine.

Figure 5:
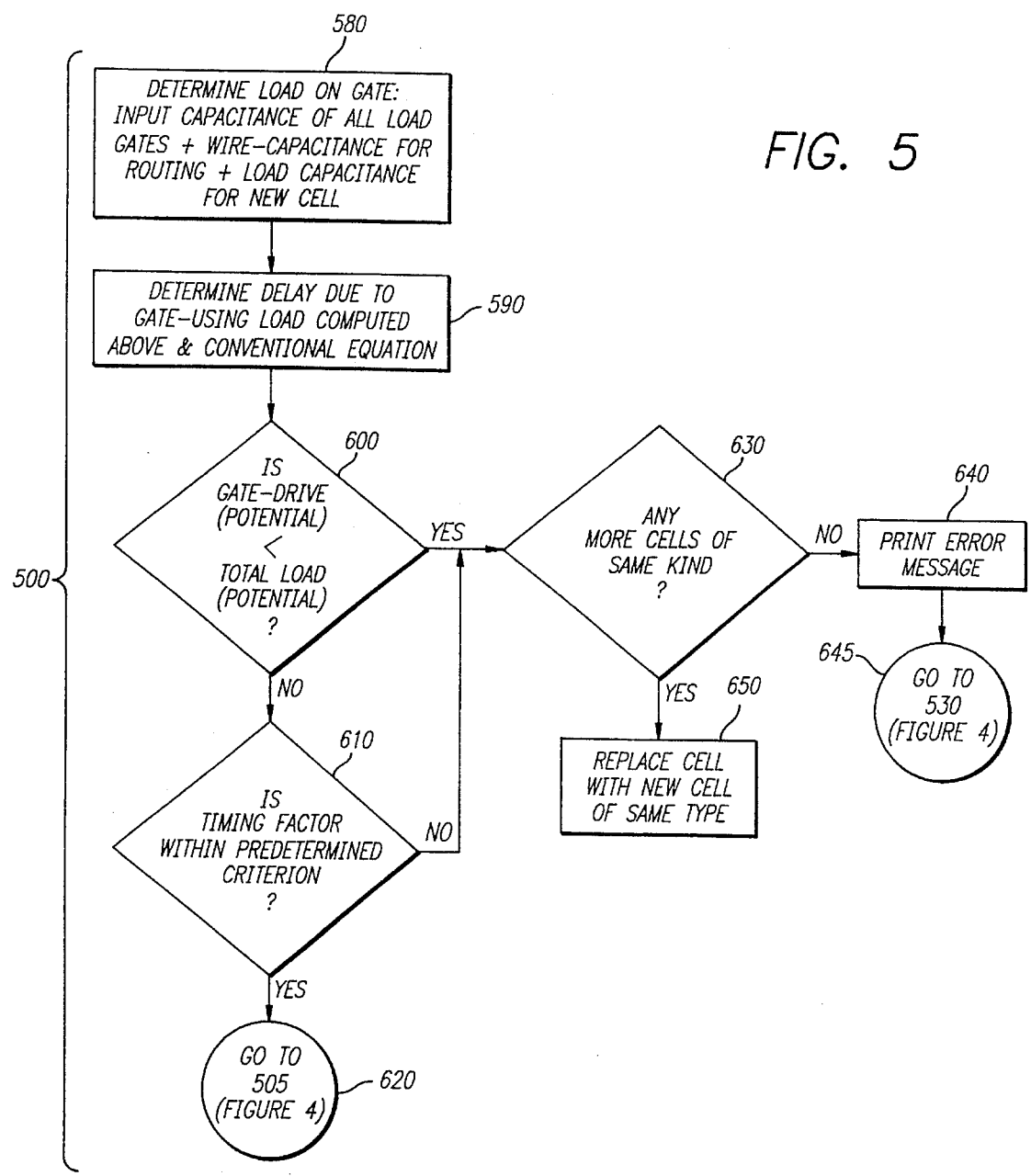

FIG. 5 is a flow chart for the step 500 of the flow chart for the sizing routine of FIG. 4.

Figure 6:
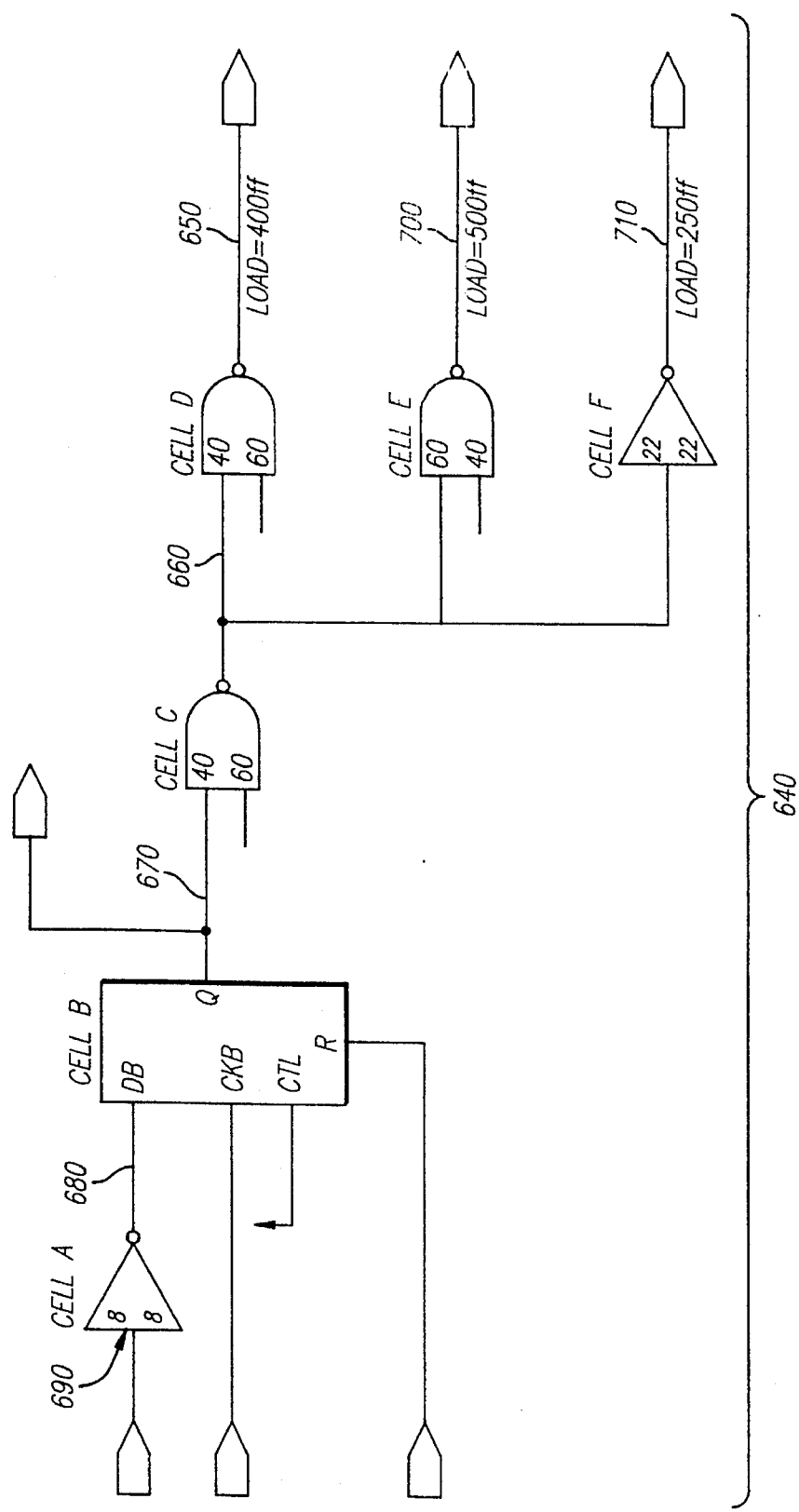

FIG. 6 is an example of a circuit which may be sized using the system of the present invention.

DETAILED DESCRIPTION OF THE PREFERRED EMBODIMENTS

The sizing system optimizes a circuit design to conform to user-specified performance criteria by replacing standard cells in the designs with other standard cells, from a standard cell library, which perform equivalent functions but which possess different operating characteristics or parameter values.

In the following discussion, it should be understood that the sizing system of the invention is preferably embodied in a computer program having appropriate memories for storing the parameters which are involved, for instance the standard cell library and the cell characteristics which are discussed in greater detail below. The computer and memories which are used are standard in the industry.

Figure 1:
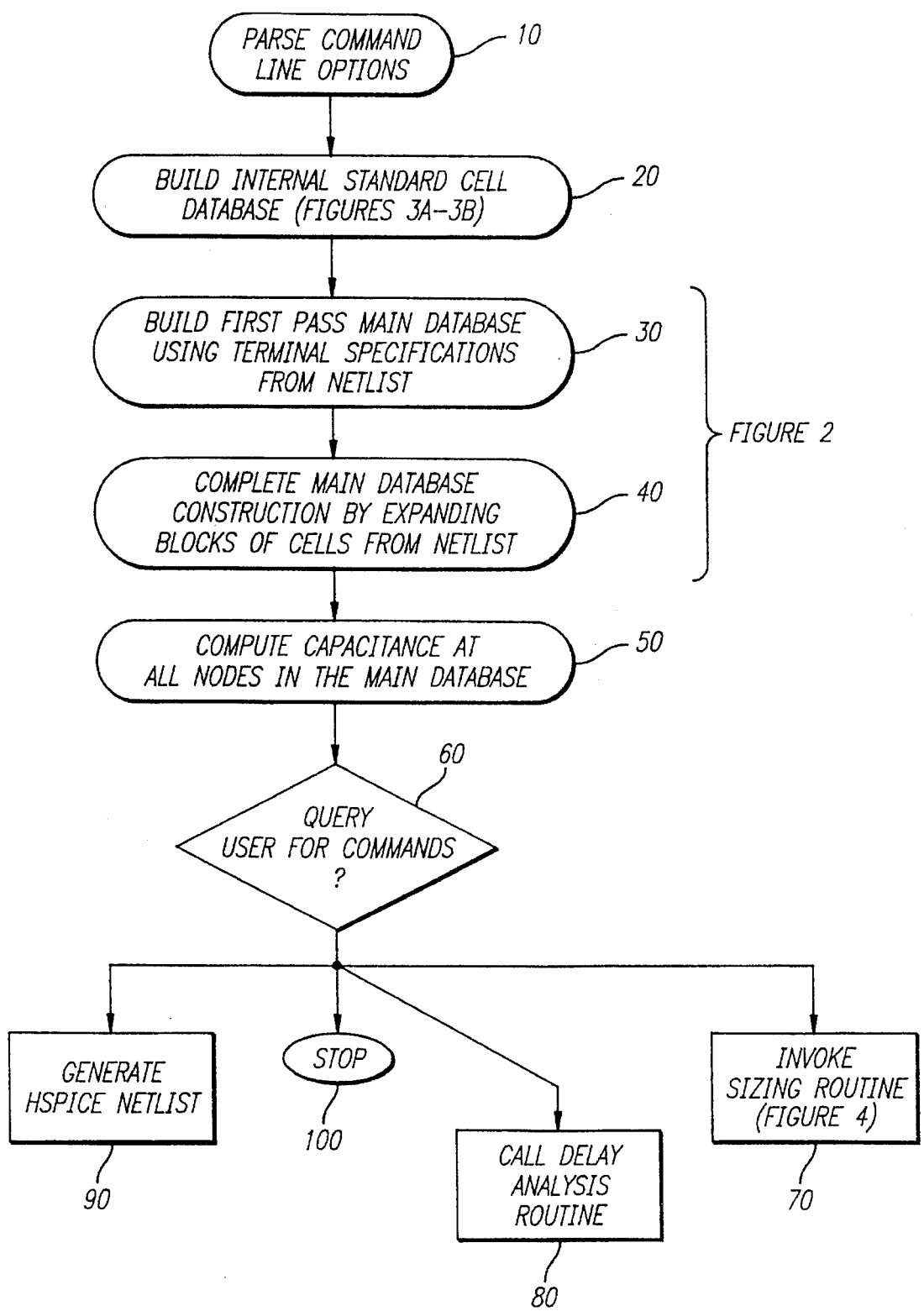
FIG. 1 is a high level program flow chart for the preferred embodiment of the invention.
Figure 2:
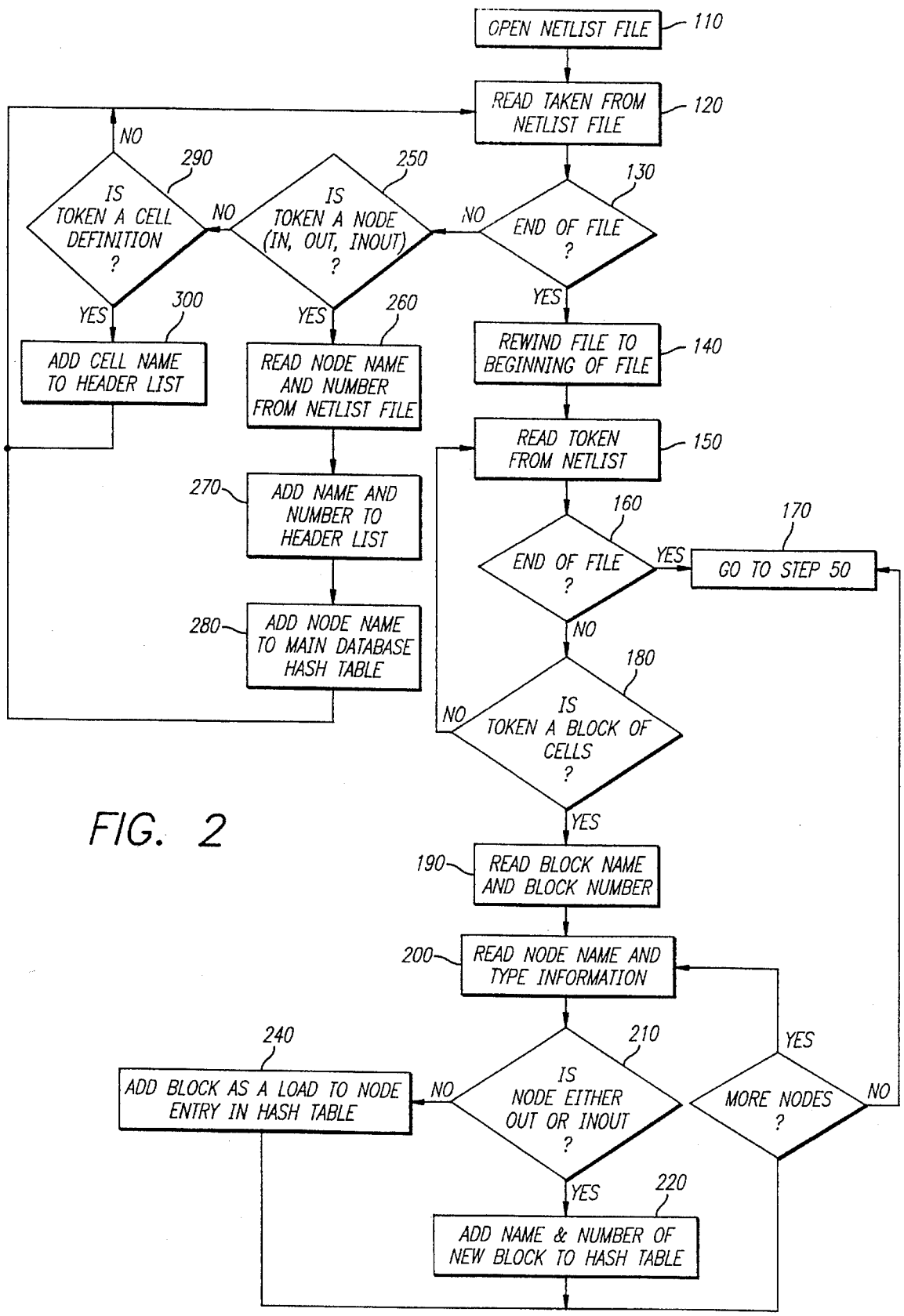
FIG. 2 is a flow chart of the process for building the internal standard cell database.

FIG. 1 is a top-level flow diagram for the system, with certain portions being shown in greater detail in the other figures. FIG. 2 shows in detail the procedure of steps 30 and 40 of FIG. 1; FIG. 3 (including FIGS. 3A and 3B) shows in detail the procedure of step 20 of FIG. 1; and FIG. 5 shows in detail the procedure of step 500 of FIG. 4. The procedure of FIG. 1 is first described, and then the more detailed procedures of FIGS. 2–5.

FIG. 1—The Sizing System Program Flow

The program flow diagram of FIG. 1 includes the following steps:

Step 10—Parse Command Line Options

When the sizing system is invoked, command line options may be appended. These options direct the sizing system to perform some combination of functions, which are predetermined. The sizing system parses these options in a conventional manner in order to decide what functions to perform and how to perform them.

Step 20—Build Internal Standard Cell Database

In this step, which is detailed in FIGS. 3A–3B, the sizing system generates an internal representation of the standard cell library in the form of a hash table in memory. This enables the sizing system to access this information more quickly than if it were stored on disk.

The sizing system builds this hash table by extracting from the standard cell library all the information on each standard cell that the sizing system needs to perform its functions. This hash table contains an entry for each standard cell in the library; in addition, the sizing system pulls in information from the process file, corresponding to each standard cell, which is not contained in the standard cell library.

Step 30—Build First Pass Internal Database Using Node Specifications From Netlist In this step, which comprises steps 110–130 and 250–300 in FIG. 2 (which is discussed in detail below), the sizing system builds two hash tables in memory—one containing the names and numbers of all nodes in the circuit ("node header hash table") and the other containing the names of all standard cells in the circuit ("cell header hash table")—and begins to construct an internal main database, also in the form of a hash table, describing the connectivity of the circuit, by adding the names of all of the circuit's nodes to the main database hash table.

Step 40—Complete Main Database Construction by Expanding Blocks of Standard Cells From Netlist In this step, which comprises Steps 140–240 in FIG. 2, the sizing system finishes building the main database hash table by expanding blocks of standard cells from the netlist. The sizing system explodes each block of such standard cells into the standard cells themselves. Thus, the sizing system is able to describe the connectivity of the circuit at the level of individual standard cells rather than at the level of aggregations of such cells. This allows the sizing system to size the entire circuit at the standard cell level.

Step 50—Compute Capacitance on all Nodes in the Main Database

In this step the sizing system computes the capacitance at each node in the circuit and stores this information in the main database under the node name. The sizing system starts at each output of the circuit and traverses each possible path from that output to each input. At each node, the sizing system notes the cumulative capacitance seen at that point in the circuit.

Step 60—Query User for Commands

At this step, the sizing system queries the user for commands. These commands are similar to the command line options parsed in step 10. One such command invokes the sizing system's sizing routine (see step 70 in FIG. 4, which is discussed below). Other commands which may be invoked by the user are: a command to delay the analysis routine (step 80); stop the program (step 100); or to generate an HSPICE netlist (step 90). In the present invention, it is the sizing routine (invoked at step 70) which is of interest.

FIG. 3—Build Internal Standard Cell Database

FIG. 3, including FIGS. 3A and 3B, shows in detail the procedure for accomplishing step 20 of FIG. 1. The sizing system begins by opening the standard cell characterization file (step 310), which is a component of the standard cell library. The characterization file contains all of the information on each standard cell that the sizing system requires for its operation, including the capacitance of each cell.

Next, the sizing system enters a first loop (including steps 320–360) to process each standard cell entry in the characterization file. For each such entry, the sizing system reads the standard cell name from the characterization file (step 320), builds a standard cell entry header and adds it to the standard cell hash table (step 330), reads parameters associated with that standard cell in the characterization file (step 340), and writes those parameters to the hash table (step 350).

The sizing system writes the standard cell entry header at a location in the hash table which it computes from the cell name. It appends the parameter information for each standard cell following its corresponding cell header in the hash table.

After the sizing system finishes processing every entry in the characterization file (step 360), it closes that file and opens the process file (step 370, FIG. 3B). In the second loop (i.e., the loop of steps 380–460 in FIG. 3B, discussed in detail below), the sizing system extracts, from the process file, information associated with each standard cell in its standard cell hash table. The process file contains standard cell parameter values which are process-dependent— i.e., values which depend on the physical process used to create the cell.

Thus, after the second loop, the standard cell hash table will contain an entry for each standard cell in the characterization file along with standard cell parameter values extracted from the characterization file and process-dependent standard cell parameter values extracted from the process file.

Each iteration of the second loop involves reading a standard cell name from the process file (step 380), and looking it up in the standard cell hash table (step 390). At this point, in step 400, the system tests for whether the cell name is in the hash table; if it is not, an error has occurred, and the system prints an error message at step 460.

In step 410, the standard cell header is read, and the first parameter associated with that standard cell is obtained in step 415. Then, in step 420, the system tests for whether this parameter already exists. If it does, this means that there is more than one entry of the parameter for a given cell. In this case, the system branches to step 450 to overwrite the already existing parameter.

If the parameter does not already exist, then the system proceeds to step 430, which involves testing for whether there is any missing values or parameters in the characterization file according to their cross-reference pairs, as described above in the Summary of the Invention. If there is, then in step 435 the system adds an entry for this cross-reference value, and in step 420 once again tests for redundancy of parameters.

Following either step 430 or 450, Step 455 determines whether there exists any additional parameters in the cell. If there are not, then during step 440, a determination is made for whether there are any more cells for which parameters must be read from the process file. When parameters of all of the cells have been considered, then the system returns at step 480 to FIG. 1 and proceeds with step 30.

FIG. 2—Build Main Database Hash Table, Node Header Hash Table and Cell Header Hash Table The procedure of FIG. 2 specifies the details of steps 30 and 40 of FIG. 1. First, the sizing system must open the netlist file in order to access its contents (step 110). Then, the sizing system enters the first loop. During each iteration of this loop, the sizing system reads a token (i.e., a string of characters separated by spaces) from the netlist file and then decides whether the token is an end-of-file marker (step 130), a node (step 250), or a cell definition (step 290).

If the token is an end-of-file marker, the sizing system exits the first loop and proceeds to the second loop.

If the token is a node, the sizing system reads its name and number from the netlist file (step 260) and adds this information to the node header hash table (step 270). In addition, the sizing system adds the name of the node to the main database hash table (step 280).

If the token is a cell definition, the sizing system adds the name of the cell to the cell header hash table (step 300).

Upon encountering an end-of-file, the sizing system prepares for the second loop by resetting the netlist file pointer to the beginning of the netlist file (step 140). Each iteration of the second loop consists of reading a token from the netlist file (step 150) and deciding whether the token is an end-of-file marker (step 160), a block of cells (step 180), or neither.

If the token is an end-of-file, the second loop is complete. If the token is neither an end-of-file nor a block of cells, the sizing system returns to the beginning of the second loop to read another token. If the token signifies a block of cells, the sizing system expands this block of cells into a combination of individual standard cells. Note that this block may itself contain blocks, etc., of standard cells. The sizing system expands the block down to the level of individual standard cells regard less of the number of hierarchical levels involved.

Then, for each node in this network of standard cells, the sizing system queries whether the node is an output (including an input/output). If the node is an output, the sizing system adds the name and number of the standard cell to which the output is connected to the main database hash table (step 220). The sizing system also adds the name and number of the block of cells itself to the main database.

Finally, if the node is not an output, the sizing system adds the block as a load to the node's entry in the hash table.

FIG. 4—Size Circuit

Before invoking the sizing routine (in step 70 of FIG. 1), the sizing system must have finished constructing its main database/hash table describing the connectivity of the circuit between standard cells. The construction of this database was detailed in FIG. 2. Note that this main hash table is comprised of two logically distinct hash tables—one is the standard cell hash table and the other is the netlist connectivity hash table. Although these two hash tables are logically distinct, their entries may be interspersed with each other within the same block of memory.

The sizing system begins its sizing routine by initializing the hash table pointer to the beginning of the main hash table and setting the sized cell count to zero (step 470). The sizing system then reads through each entry in the hash table, discarding any nonstandard cell entries it comes across and processing only netlist entries corresponding to the path the user wishes to be sized (steps 480, 530 and 540). Thus, in step 480, the sizing system inspects for whether the current entry is valid, i.e., whether it represents a standard cell in the library. If it does not, then no sizing is attempted on this cell.

Upon encountering a netlist entry, the sizing system first looks up the total capacitance associated with the current node (step 490), and then proceeds to the tests of step 500, which are detailed in FIG. 5, discussed below. In short, the invention both matches the load characteristics (i.e., potential) required at each node in the circuit, and additionally insures that the timing criteria (i.e., RC characteristics) are met. This may entail, for any given node, replacing a standard cell with another standard cell of a different size.

If a standard cell was replaced, then the system branches, in step 505, to step 510, where the hash table is updated with information about the new cell, including total capacitance at the current node, given the new cell. Then, in step 520, the total of the sized cell count is incremented by one. Otherwise—i.e., if no standard cells were replaced in step 500—the system branches directly to step 530 (which is also the step following step 520). At this point, the system increments the hash table pointer to the next entry.

When the hash table pointer exceeds the valid range (step 540), this indicates that all of the hash table entries have been processed. At this point, the sizing system updates the load capacitances on all nodes in the main database (see FIG. 4 step 530). Finally, if the sized cell count is non zero, then the sizing routine terminates; otherwise, the entire routine is reinvoked from the beginning (step 560).

FIG. 5—Adjust Cell Size

FIG. 5 depicts the details of Step 500 shown in FIG. 4, relating to the procedure for adjustment of the circuit to insure proper driving characteristics for the load at each node, and to insure the fulfillment of the user predetermined timing criteria are met. This procedure, encompassing steps 580–650 of FIG. 5, will first be described generally, and will then be described with reference to the example circuit shown in FIG. 6.

The sizing system first determines the load at the node in question of circuit under consideration, as specified in step 580 shown in FIG. 5, by summing the total of all the loads coupled to the node in the path toward the output of the circuit, including the output capacitance of the cell driving the node. In making this determination, the system preferably includes load due to physical connections and other physical characteristics (referred to generally as "wire capacitance").

In step 590, the timing delay for the path in question is computed in a standard manner, taking into account the RC characteristics for each standard cell (i.e., gate) in the path (i.e., output to input of path). More particularly, in the preferred embodiment of the invention, the sum of the propagation delays through all of the cells driving the the nodes in the path is calculated, including the propagation delay through the cell driving the current node being evaluated.

The system then determines, in step 600, whether the driving characteristics of the cell driving the node can accommodate the total load characteristics. If the total load is properly met by the driver, i.e., cell drive value is not less than the total load value (see step 600), then the system proceeds to step 610. Otherwise, processing continues to step 630.

Referring to step 610, the system tests for whether the path delay for the path in question is within the user-predetermined timing criterion. If it is, the system proceeds to step 505 of FIG. 4, wherein a determination is made as to whether the cell has been replaced. If the cell has been replaced, processing continues to step 510 (FIG. 4) during which the hash table is updated with the new cell, and the sized cell count is incremented (in step 520). Otherwise, processing proceeds to step 530, during which the hash table pointer is incremented. The remaining procedures of FIG. 4 are then continued as discussed earlier.

Returning to FIG. 5 at step 610, if the path delay is determined to be greater than the user-specified predetermined timing criterion for that path, then this means that the cell should be replaced by an appropriate cell which can help the circuit path being optimized to properly meet the timing criterion (i.e. improve the performance of the circuit). Thus, in step 630, the system inspects the cell library to determine whether there are any cells of the same function available, but with smaller propagation delay.

If there is such a cell available, then in step 650 the system replaces the cell in question. In replacing any given standard cell, the sizing system selects, as the replacement cell, another standard cell from the standard cell library which performs the equivalent function and which has at least the same drive capability, while either permitting or contributing to the satisfaction of the user-specified timing criterion for the path. Once the cell has been replaced in step 650 with a faster cell, the system returns to step 600, and again tests for whether the drive characteristics at the node in question are adequate to meet the load characteristics of the path.

It may be that the sizing system will be unable to size a given standard cell, i.e., will not be able to find an appropriate cell having an equivalent function with at least the same drive capability while either permitting or contributing to the satisfaction of the timing requirements specified for the path being optimized. In such a case, the system prints out an error message (step 640) and continues onto the next hash table entry—that is, at step 645, processing proceeds to step 530 (FIG. 4) and carries out the sizing routine at the next node on the path under consideration toward the input of the circuit.

Returning to block 600, if the drive capability was determined to be less than the required load, the system branches to step 630 and determines whether a larger cell (i.e., with a larger drive capability) of the same type (i.e., function) is available. Steps 600, 610, 630 and 650 are repeated either until a proper cell type of the required size is found, or until the system determines that no appropriate cell of the correct type is available. If no appropriate cell of the correct type can be found in the library, then an error message is produced during step 640 and processing continues at step 645. Otherwise, the appropriate cell will have been found in the library, and processing will continue at step 620, during which processing returns to step 505 of FIG. 4.

AN EXAMPLE

Referring now to FIG. 6, a brief discussion of an example is now presented. The first node which is inspected by the system is the output 650, as shown in FIG. 6. As indicated in that figure, the load at output 650 is, for example, 400 femtofarads. (An equivalent gate load, as discussed above in the Summary of the Invention, is preferably used.) The system insures that cell D is able to drive this load within the user-prescribed time constraints, by means of the procedures of FIGS. 4 and 5. Once this is done, the system proceeds to the next node (accessed by the hash table pointer which is incremented in step 530), and repeats the procedure.

Thus, in FIG. 6, when cell D has been sized, the load characteristics at node 660 are inspected. In this example circuit, the equivalent gate load presented to node 660 by the input of cell D is 40 femtofarads, the gate load presented to node 660 by cell E is 60 femtofarads and the gate load presented to node 660 by cell F is 22 femtofarads. The load presented to node 660 by the output driver of cell C and the parasitic capacitances associated with the interconnect (the value of which are not indicated in FIG. 6) are also included in the total load on node 660. Thus the sizing system must determine that the driver, here cell C, meets this load. Again, this is done by the procedure of FIGS. 4 and 5 as described above.

In this manner, the sizing system proceeds from node to node to the input of the page 640, along the path under consideration. (A "page" as used herein is a circuit or a portion thereof which includes more than one cell.) In FIG. 6, the path followed at first proceeds to node 670, then node 680, and finally node or input 690, sizing cells B and A along the way. Once input 690 is reached, the sizing system has insured (assuming that the requisite appropriate cells are available in the cell library) that the drive characteristics along the entire path have properly been met, and that the user predetermined circuit time and load characteristics are met.

The procedure is also followed for the paths including cells E and F, beginning with nodes or outputs 700 and 710, respectively. It will be noted that cells A, B and C are common to the three paths which include, respectively, cells D, E and F. Thus, cells A, B and C may be sized more than once. However, cells D, E and F will only be sized once. Indeed, if the upper input of cell E (which has an equivalent gate load of 60 femtofarads in this example) must be increased to drive its load of 700 femtofarads, it may well be that the drive of cell C is inadequate after the path of cells D-C-B-A is sized. In that case, the sizing system will automatically resize cell C when the path E-C-B-A is sized.

Once this procedure is followed for each of the paths for which sizing is desired, assuming that appropriate cells of the requisite performance exist in the cell library, the delay and drive characteristics of the entire circuit will fall within the predetermined criteria, and the components of the circuit will have been automatically sized. The user will have as an output a new circuit, stored in the memory of the computer, which is then used in a conventional manner for printing schematics, testing circuit characteristics (such as by means of HSPICE), or the physical layout of the circuit for manufacture, as in stage 5 discussed above in the Background of the Invention. If the predetermined characteristics for certain cells or paths in the circuit are not met (i.e. because appropriate standard cells of the requisite performance do not exist in the cell library), then the user is provided with appropriate error messages, so that the circuit can then be redesigned to resolve the problem. Thus, the sizing system of the present invention provides an efficient manner of automatically adjusting component characteristics to match characteristics specified in advance.

The invention has been described in an exemplary and preferred embodiment, but it is not limited thereto. Those skilled in the art will recognize that a number of additional modifications and improvements can be made to the invention without departure from the essential spirit and scope. The scope of the invention should only be limited by the following claims.

What is claimed is:

1. A method of ensuring that an electronic circuit meets one or more predetermined performance criteria, the electronic circuit comprising a plurality of electronically connected components, the plurality of connected components organized by function into one or more blocks, the one or more blocks connected to form one or more paths, each of the one or more paths having an input and an output, at least one of the one or more paths required to meet one of the one or more predetermined performance criteria, each of the one or more blocks represented by one of a plurality of standard cells stored in a library, each of said plurality of standard cells comprising data which models physical and performance characteristics of the block it represents, said method comprising the steps of:

storing in a memory a netlist which defines the connectivity between the one or more blocks of the electronic circuit as nodes and identifies which of the plurality of standard cells represents each of the one or more blocks;

for each of the at least one of the one or more paths required to meet one of the one or more predetermined performance criteria:

determining total capacitance at each of the nodes of the path;

determining the timing delay for the path, for each of the one or more blocks currently driving one of the nodes of the path:

checking whether the timing delay for the path is within the predetermined performance criteria for the path while using the current block;

if the timing delay is not within the predetermined performance criteria, searching the library for an appropriate cell that represents a different block which performs the same function and has performance characteristics which would improve circuit performance;

if the appropriate cell is found, substituting the different block for the current block; and generating an updated version of the netlist which reflects the substituted blocks and therefore represents an optimized version of the electronic circuit.

2. The method of claim 1 wherein said checking, said searching and said substituting steps are performed on each of the one or more blocks currently driving one of the nodes of the path beginning with the one of the one or more blocks driving the output of the path and proceeding sequentially to the one of the one or more blocks coupled to the input of the path.

3. The method of claim 1 wherein the step of determining the capacitance at each node further comprises the step of summing the capacitance presented by inputs of blocks coupled to the node, and the capacitance presented by the output driver of the block driving the node.

4. The method of claim 3 wherein the step of determining the capacitance at each node further comprises the step of obtaining the input capacitances of each block coupled to the node and the capacitance of the output driver of the block driving the node from the physical characteristics of each standard cells representing the blocks coupled to the node.

5. The method of claim 1 wherein the method further comprises the step of building a standard cell hash table to index physical and performance characteristics of the standard cells stored in the library.

6. The method of claim 1 wherein the step of determining the timing delay for the path further comprises the step of summing the propagation delays for each of the one or more blocks of the path.

7. The method of claim 6 wherein the step of determining the timing delay further comprises the step of using the performance characteristics of the cells representing each of the one or more blocks in conjunction with the load on the nodes of the path driven by each of the one or more blocks to determine the propagation delay for each of the one or more blocks.

8. The method of claim 7 wherein the performance characteristics of each of the standard cells is obtained using conventional circuit stimulation techniques.

9. The method of claim 1 wherein the step of searching the library further comprises the step of determining whether one of the plurality of standard cells with a function equivalent to the current block has performance characteristics such that the overall timing delay of the path will be reduced toward the predetermined performance criterion if the block it represents well substituted for the current block.

10. The method of claim 9 wherein the step of substituting the different block for the current block further comprises the step of updating the capacitance value for the nodes coupled to the substituted different block.

11. The method of claim 1 wherein said checking step further comprises the step of checking whether the performance characteristics of the standard cell representing the current block are sufficient to properly drive the load at the mode driven by the current block.

12. The method of claim 1 further comprising the step of issuing an error message to a user when no appropriate cell is found.

* * * * *